(12) United States Patent
Cho et al.

(10) Patent No.: US 10,754,482 B2
(45) Date of Patent: Aug. 25, 2020

(54) DISPLAY APPARATUS HAVING TOUCH SCREEN CAPABLE OF IMPROVING TOUCH SENSITIVITY

(71) Applicant: LG DISPLAY CO., LTD., Seoul (KR)

(72) Inventors: Yoondong Cho, Paju-si (KR); Jonghyun Han, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/211,907

(22) Filed: Dec. 6, 2018

(65) Prior Publication Data
US 2019/0179449 A1    Jun. 13, 2019

(30) Foreign Application Priority Data

Dec. 7, 2017 (KR) .......................... 10-2017-0167633

(51) Int. Cl.
*G06F 3/045* (2006.01)
*G06F 3/044* (2006.01)
*H01L 27/32* (2006.01)
*G06F 3/041* (2006.01)

(52) U.S. Cl.
CPC ............ *G06F 3/044* (2013.01); *G06F 3/0412* (2013.01); *G06F 3/0446* (2019.05); *G06F 3/04164* (2019.05); *H01L 27/323* (2013.01); *H01L 27/3276* (2013.01); *G06F 2203/04111* (2013.01)

(58) Field of Classification Search
CPC ...... G06F 3/044; G06F 3/0446; G06F 3/0412; G06F 3/04164; H01L 27/323; H01L 27/3276

USPC ......................................................... 345/174
See application file for complete search history.

(56) References Cited

U.S. PATENT DOCUMENTS

| 2015/0205418 | A1 | 7/2015 | Nam et al. |
| 2016/0126304 | A1 | 5/2016 | Cho et al. |
| 2018/0032189 | A1* | 2/2018 | Lee .......................... G06F 3/044 |
| 2018/0033830 | A1* | 2/2018 | Kim .......................... G06F 3/044 |
| 2018/0177050 | A1 | 6/2018 | Li et al. |

FOREIGN PATENT DOCUMENTS

WO    WO 2017/197926 A1    11/2017

* cited by examiner

*Primary Examiner* — Adam J Snyder
(74) *Attorney, Agent, or Firm* — Birch, Stewart, Kolasch & Birch, LLP (57) ABSTRACT

An electroluminescence display apparatus having a touch screen includes a display panel including pixels disposed in a display area, a first power supply electrode positioned in a non-display area outside the display area and supplying first power to the pixels, and a second power supply electrode supplying second power to the pixels, a plurality of first and second touch electrodes disposed in the display area and disposed to cross over each other and to be electrically insulated from each other, a plurality of first touch routing lines disposed in the non-display area and respectively connected to the first touch electrodes, and a plurality of second touch routing lines disposed in the non-display area and respectively connected to the second touch electrodes, wherein at least one of the first and second power supply electrodes includes a plurality of first openings overlapping the plurality of first touch routing lines.

20 Claims, 7 Drawing Sheets

DISPLAY APPARATUS HAVING TOUCH SCREEN CAPABLE OF IMPROVING TOUCH SENSITIVITY

CROSS-REFERENCE TO RELATED APPLICATION

This disclosure claims the benefit of priority under 35 U.S.C. § 119(a) to the Republic of Korea Patent Application No. 10-2017-0167633 filed in the Republic of Korea on Dec. 7, 2017, which is incorporated herein by reference in its entirety into the present application.

BACKGROUND OF THE INVENTION

Field of the Invention

The present disclosure relates to a display apparatus having a touch screen.

Description of Related Art

The demand for display apparatuses for displaying images in various forms has increased. For example, flat panel displays (FPDs), which are thinner, lighter, and larger, have replaced bulky cathode ray tubes (CRTs) and continue to be developed. Various types of FPDs such as a liquid crystal display (LCD), a plasma display panel (PDP), an electroluminescent display (EL), a field emission display (FED), and an electrophoretic display (ED) have been developed and utilized.

These display apparatuses have been used in various electronic products such as TVs, computer monitors, notebook computers, mobile phones, display units of refrigerators, personal digital assistants, and automated teller machines and the like. In general, such display apparatuses can have a user interface using various input devices such as keyboards, computer mouses, digitizers, and the like. However, the use of a separate input device such as a keyboard and a mouse requires users to learn how to use such devices and there are inconveniences such as occupying too much space and the like. Thus, a demand for input devices which are convenient and simple to use with minimal malfunctions is growing. To meet this demand, touch screens allowing users to input information by directly contacting a screen with a finger, pen, or the like, have been proposed.

The touch screen can be classified into an add-on type, an on-cell type, and an integrated type according to the type of structures.

In the add-on type touch screen, a display apparatus and a touch panel are separately manufactured, and then the touch panel is adhered (or attached) to an upper plate of the display apparatus.

In the on-cell type touch screen, elements constituting a touch screen are directly formed on a surface of a top plate of a display apparatus.

In the integrated type touch screen, elements constituting a touch screen are formed on an inner side of a top plate of a display apparatus.

These touch screens can be applied to various display apparatuses. In particular, when applied to an electroluminescent display apparatus, elements constituting a touch screen can be formed in upper and lower portions of an encapsulation film for protecting a light emitting part of the electroluminescent display apparatus. That is, touch driving electrodes constituting a touch drive signal transmission channel of the touch screen and touch sensing electrodes constituting a touch recognition signal reception channel are formed on an upper surface and/or a lower surface of the encapsulation film covering the display elements of the electroluminescent display apparatus. In such a configuration, when a voltage is supplied to a cathode electrode of the electroluminescent display apparatus, the touch electrodes constituting the touch recognition signal reception channel are affected and degrade the touch recognition sensitivity of the apparatus.

SUMMARY OF THE INVENTION

An aspect of the present disclosure provides a display apparatus having a touch screen in which defects due to malfunctions of the touch screen are reduced and the sensitivity of the touch screen is improved when compared to the related art display apparatuses.

According to an aspect of the present disclosure, a display apparatus having a touch screen includes a display panel including pixels disposed in a display area for displaying information, a first power supply electrode positioned in a non-display area outside the display area and supplying first power to the pixels, and a second power supply electrode supplying second power to the pixels; a plurality of first touch electrodes and a plurality of second touch electrodes disposed in the display area of the display panel and disposed to cross over each other and to be electrically insulated from each other; a plurality of first touch routing lines disposed in the non-display area of the display panel and respectively connected to the plurality of first touch electrodes; and a plurality of second touch routing lines disposed in the non-display area of the display panel and respectively connected to the plurality of second touch electrodes, wherein at least one of the first and second power supply electrodes includes a plurality of first openings overlapping the plurality of first touch routing lines.

According to the display apparatus having a touch screen of the present disclosure, the openings of the first power supply electrode and/or the second power supply electrode disposed to overlap the touch routing lines of the touch screen are equally arranged to regulate the magnitudes of parasitic capacitance formed therebetween to be equal, whereby a defect due to malfunctions of the touch screen can be reduced and the sensitivity of the touch screen can be enhanced.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION OF THE EMBODIMENTS

Advantages and features of the disclosure, and implementation methods thereof will be clarified through following embodiments described with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Further, the disclosure can be defined by scope of claims.

The shapes, sizes, ratios, angles, numbers and the like disclosed in the drawings for describing the embodiments of the disclosure are illustrative and are not limited to those illustrated in the present disclosure. Like reference numerals refer to like elements throughout the specification. Further, in the description of the present disclosure, detailed description of known related arts will be omitted if it is determined that the gist of the present disclosure can be unnecessarily obscured. Where the terms "comprises", "having", "done", and the like are used in this disclosure, other portions can be added as long as "only" is not used. Unless the context clearly dictates otherwise, including the plural unless the context clearly dictates otherwise.

In construing an element, such shall be construed to include an error range although there can be no explicit description.

In describing a positional relationship, for example, when two portions are described as "~on", "~above", "~below", or "~on the side", one or more other portions can be positioned between the two portions unless "immediately" or "directly" is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the disclosure Features of various embodiments of the disclosure can be partially or overall coupled to or combined with each other and can be variously inter-operated with each other and driven technically as those skilled in the art can sufficiently understand. The embodiments of the disclosure can be carried out independently from each other or can be carried out together in co-dependent relationship.

Hereinafter, a display apparatus including a touch screen according to an embodiment of the disclosure will be described with reference to the accompanying drawings. Like reference numerals throughout the specification denote substantially identical components. In the following description, when the detailed description of the relevant known function or configuration is determined to unnecessarily obscure some important points of the disclosure, the detailed description will be omitted or briefly described.

Hereinafter, a display apparatus having a touch screen according to an embodiment of the disclosure will be described with reference to FIGS. 1 and 2. All the components of the display apparatus having the touch screen according to all embodiments of the disclosure are operatively coupled and configured.

Figure 1:
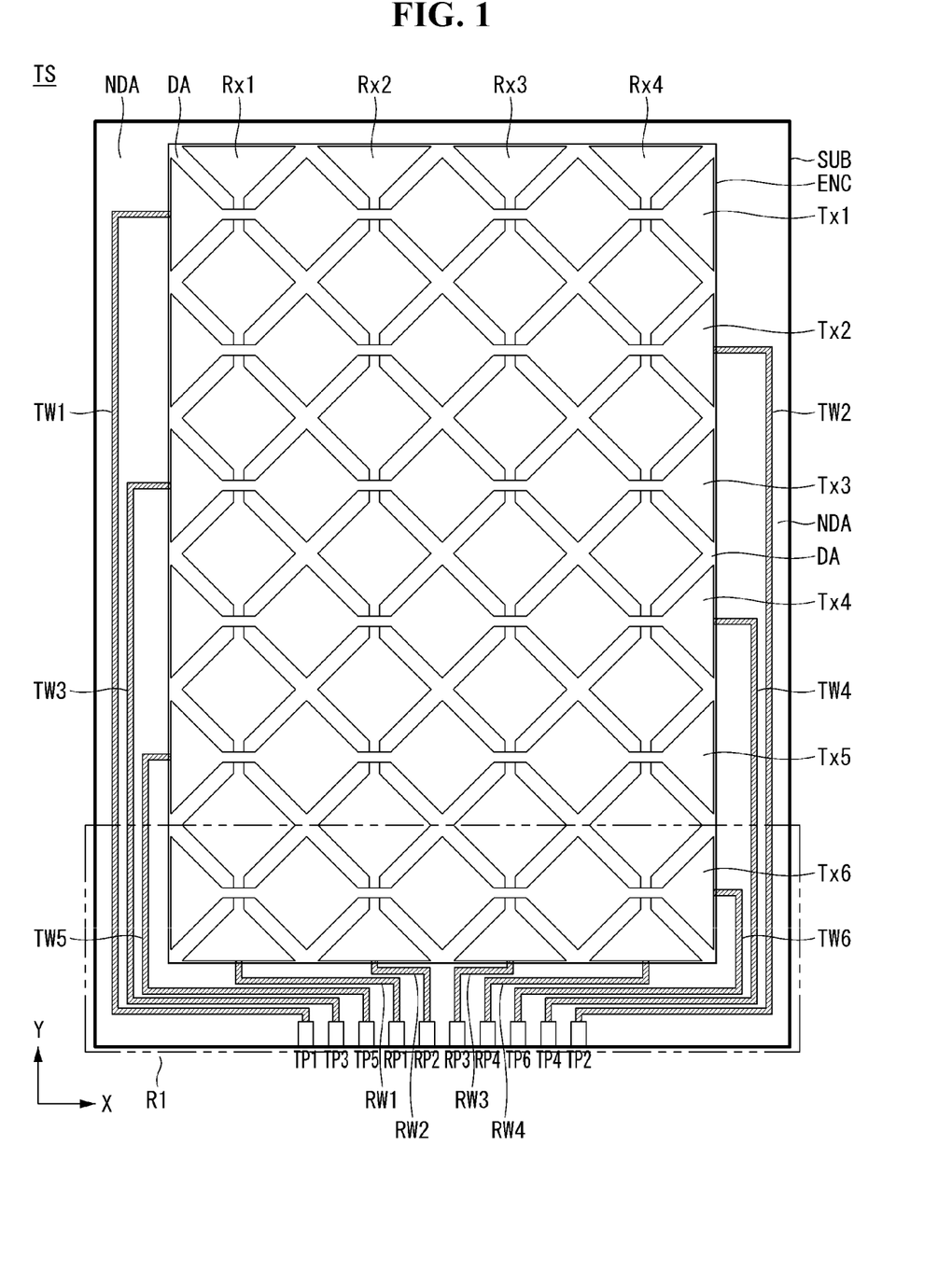
FIG. 1 is a plan view illustrating a display apparatus including a touch screen according to an embodiment of the disclosure.
Figure 2:
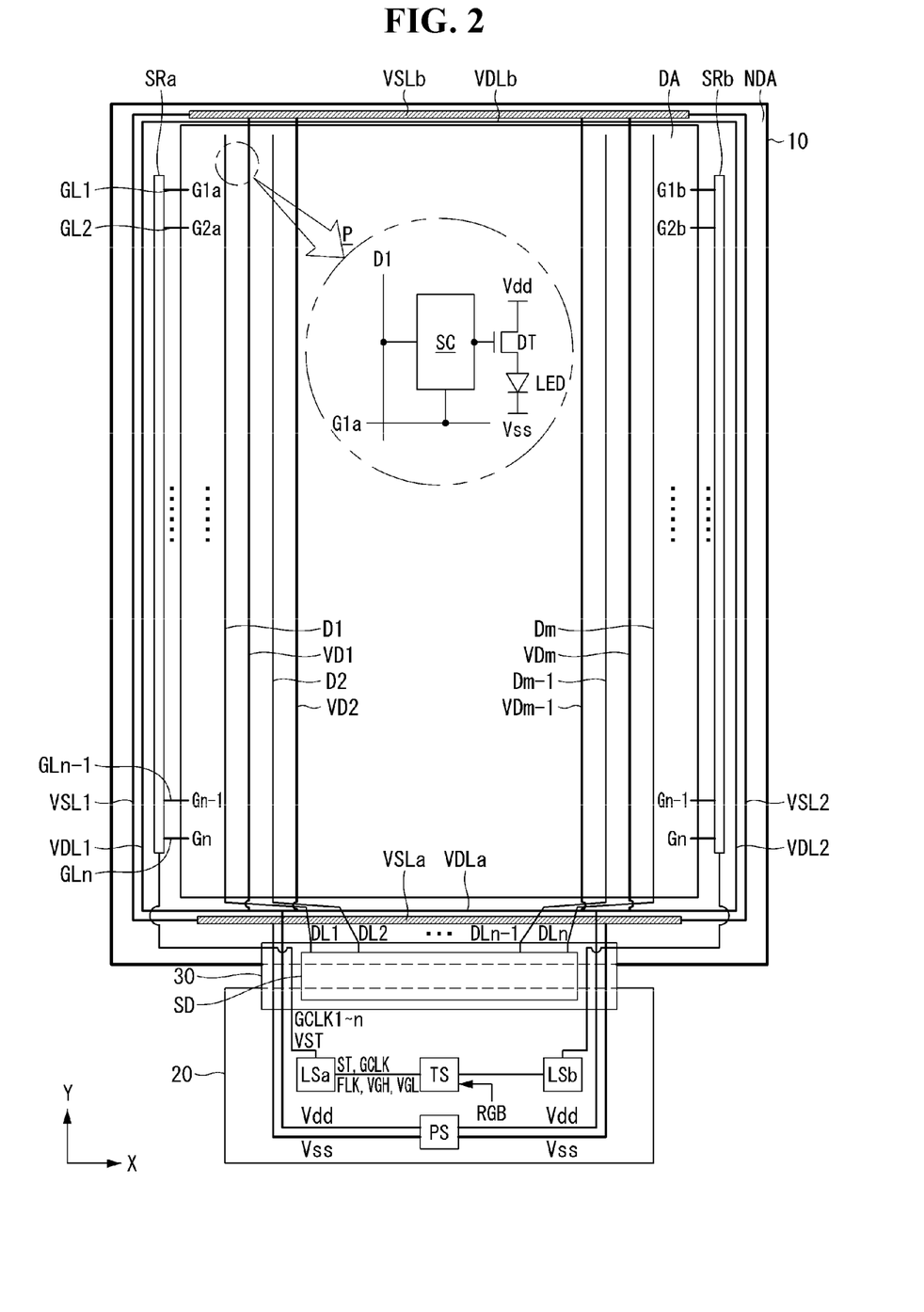
FIG. 2 is a plan view schematically illustrating a configuration of a display apparatus excluding the touch screen in FIG. 1.

FIG. 1 is a plan view illustrating a display apparatus including a touch screen according to an embodiment of the disclosure, and FIG. 2 is a plan view schematically illustrating a configuration of a display apparatus excluding the touch screen in FIG. 1. In order to simplify the description, FIG. 1 illustrates only a configuration of a touch screen of a display apparatus and FIG. 2 illustrates only a configuration of a display apparatus. For exemplary purposes, an electroluminescent display apparatus will be described with reference to FIGS. 1 and 2.

In the example of FIG. 1, a touch screen TS is illustrated as an on-cell type but the inventive concepts can also be applied to an add-on type, an integrated type, or other types. Therefore, the example of the touch screen should not be limited to the on-cell type according to the explanation illustrated in FIG. 1 but must be construed to include the integrated type as well as the add-on type and other types.

Referring to FIG. 1, the touch screen TS is disposed on a substrate SUB of an electroluminescence display apparatus including a display area DA displaying an image and a non-display area NDA outside the display area DA. The touch screen TS includes a plurality of first touch electrodes Tx1 to Tx6 and a plurality of second touch electrodes Rx1 to Rx4 arranged to cross each other, a plurality of first touch routing lines TW1 to TW6 and a plurality of second touch routing lines RW1 to RW4 respectively connected to the plurality of first and second touch electrodes Tx1 to Tx6 and Rx1 to Rx4, and a plurality of first touch pads TP1 to TP6 and a plurality of second touch pads RP1 to RP4 respectively connected to the plurality of first and second touch routing lines TW1 to TW6 and RW1 to RW4.

The plurality of first touch electrodes Tx1 to Tx6 are arranged to be parallel to each other in a first direction (e.g., y-axis or column direction) on an encapsulation film ENC positioned in the display area DA of the substrate SUB and extend in a second direction (e.g., x-axis or row direction) perpendicular to the first direction. Each of the plurality of first touch electrodes Tx1 to Tx6 has a structure in which a plurality of first touch electrode patterns having a triangular, square, rhombic, or polygonal shape are connected in series, but the disclosure is not limited thereto.

The plurality of second touch electrodes Rx1 to Rx4 are arranged to be parallel to each other on the encapsulation film ENC positioned in the display area DA of the substrate SUB in the second direction and extend in the first direction. The plurality of second touch electrodes Rx1 to Rx4 can also have a structure in which a plurality of second touch electrode patterns having a triangular, square, rhombic, or polygonal shape are connected in series, like the first touch electrodes, but the disclosure is not limited thereto. For example, the first and second electrode patterns can have any other various shapes in order to improve touch recognition.

The first and second touch electrodes Tx1 to Tx6 and Rx1 to Rx4 can be formed of a transparent conductive material such as ITO, IZO, or GZO.

In order to maintain an electrically insulated state between the plurality of first touch electrodes Tx1 to Tx6 and the plurality of second touch electrodes Rx1 to Rx4, an insulating layer $_{TLI}$ can be disposed between the plurality of first and second touch electrodes Tx1 to Tx6 and Rx1 to Rx4 or insulating patterns can be disposed only at the intersections thereof.

The plurality of first touch routing lines TW1 to TW6 are arranged in the non-display area NDA of the substrate SUB and connected to the plurality of first touch electrodes Tx1 to Tx6, respectively. The first touch routing lines TW1, TW3, and TW5 are connected to left ends of the first touch electrodes Tx1, Tx3, and Tx5 arranged in the odd-numbered rows and extend to the non-display area below the display area along the non-display area on the left of the display area. The first touch routing lines TW2, TW4, and TW6 are connected to right ends of the first touch electrodes Tx2, Tx4, and Tx6 arranged in the even-numbered rows and extend to the non-display area below the display area along the non-display area on the right of the display area.

The plurality of second touch routing lines RW1 to RW4 are disposed in the non-display area NDA of the substrate SUB, connected to lower ends of the plurality of second touch electrodes Rx1 to Rx4, respectively, and extend to the non-display area below the display area.

The plurality of first touch pads TP1 to TP6 are disposed at the end of the non-display area NDA below the display area of the substrate SUB and are connected to the plurality of first touch routing lines TW1 to TW6, respectively. The first touch pads TP1, TP3, and TP5 are respectively connected to the first touch routing lines TW1, TW3, and TW5 connected to the first touch electrodes Tx1, Tx3, and Tx5 at the odd-numbered rows. The first touch pads TP2, TP4, and TP6 are respectively connected to the first touch routing lines TW2, TW4, and TW6 connected to the first touch electrodes Tx2, Tx4, and Tx6 at the even-numbered rows.

The plurality of second touch pads RP1 to RP4 are disposed at the end of the non-display area NDA below the display area of the substrate SUB and are connected to the plurality of second touch routing lines RW1 to RW4, respectively. The plurality of second touch pads RP1 to RP4 are disposed between a group of the first touch pads TP1, TP3, and TP5 and a group of the first touch pads TP2, TP4, and TP6.

The first and second touch routing lines TW1 to TW6 and RW1 to RW4 and the first and second touch pads TP1 to TP6 and RP1 to RP4 can be formed as a single layer or can have a multilayer structure. In case where the first and second touch routing lines TW1 to TW6 and RW1 to RW4 are single layers, first and second touch routing lines TW1 to TW6 and RW1 to RW4 can be formed of a metal layer such as Al, AlNd, Mo, MoTi, Cu, CuOx, or Cr. In case where the first and second touch routing lines TW1 to TW6 and RW1 to RW4 have a multilayer structure, a lower layer thereof can be formed of a metal such as Al, AlNd, Mo, MoTi, Cu, CuOx, or Cr and an upper layer can be formed of a transparent conductive material such as ITO, IZO, or the like.

Referring to FIG. 2, an electroluminescent display apparatus according to an embodiment of the disclosure can include a display panel 10, a data driver, a gate driver, a power supply PS, a timing controller TC, and the like.

The display panel 10 includes the display area DA displaying information and the non-display area NDA in which information is not displayed.

The display area DA is an area where an input image is displayed and an area where a pixel array in which a plurality of pixels P are arranged in a matrix form is disposed. The first and second touch electrodes Tx1 to Tx6 and Rx1 to Rx4 of the touch screen TS illustrated in FIG. 1 are disposed to correspond to the display area DA of the display panel 10.

The non-display area NDA is an area where shift registers SRa and SRb and various link signal lines GL1 to GLn and DL1 to DLm and power supply lines VDL1, VDL2, VSL1, VSL2, power supply electrodes VDLa, VDLb, VSLa, VSLb, and the like, of a gate driving circuit are disposed. The first and second touch routing lines TW1 to TW6 and RW1 to RW4 and the first and second touch routing lines TP1 to TP6 and RP1 to RP4 of the touch screen TS illustrated in FIG. 1 are disposed to correspond to the non-display area NDA of the display panel 10.

The pixel array disposed in the display area DA includes a plurality of data lines D 1 to Dm and a plurality of gate lines G1 to Gn arranged to cross over each other and pixels P disposed in a matrix form at every crossing (or at or near particular intersections).

Each pixel P can include a light emitting diode (LED), a driving thin film transistor (hereinafter, referred to as a driving TFT (DT) for controlling the amount of current flowing in the LED, and a programming part SC for setting a gate-source voltage of the driving TFT (DT). The pixels P of the pixel array are supplied with first power Vdd, as a high potential voltage, from the power supply PS through the first power link lines VDL1 and VDL2, the first power supply electrodes VDLa and VDLb, and the first power lines VD1 to VDm, and are supplied with second power Vss, as a low potential voltage, through the second link power lines VSL1 to VSL2 and second power supply electrodes VSLa and VSLb from the power supply PS.

The first power lines VD1 to VDm are supplied with the first power Vdd from the power supply PS on both sides through the lower first power supply electrode VDLa positioned in a bezel area BA adjacent to the side where a chip-on film 30 is adhered and the upper first power supply electrode VDLb disposed on the opposite bezel area. Both ends of the lower first power supply electrode VDLa and the upper first power supply electrode VDLb can be connected to each other by link lines VDL1 and VDL2. Accordingly, a degradation of display quality due to an increase in RC according to positions of pixels disposed in the active area AA can be minimized. However, the disclosure is not limited thereto. In some cases, the link lines VDL1 and VDL2 connecting both ends of the lower first power supply electrode VDLa and the upper first power supply electrode VDLb to each other can be omitted and replaced with only the configuration of the lower first power supply electrode VDLa and the first power lines VD1 to VDm.

The programming part SC can include at least one switching TFT and at least one storage capacitor. The switching TFT is turned on in response to a scan signal from the gate line GL, thus applying a data voltage from the data line DL to one electrode of the storage capacitor. The driving TFT DT controls a current amount supplied to the light emitting diode (LED) according to a magnitude of a voltage charged in the storage capacitor to regulate light intensity of the LED. Light intensity of the LED is proportional to the current amount supplied from the driving TFT DT.

TFTs constituting the pixel can be implemented as a p-type or an n-type. Further, semiconductor layers of the TFTs constituting the pixel can include amorphous silicon or polysilicon, or an oxide. The LED includes an anode electrode, a cathode electrode, and a light emitting structure interposed between the anode electrode and the cathode electrode. The anode electrode is connected to the driving TFT DT. The light emitting structure includes an emission layer (EML), and a hole injection layer (HIL) and a hole transport layer (HTL) can be formed on one side of the emission layer and an electron transport layer (ETL) and an electron injection layer (EIL) can be disposed on the other side of the emission layer EML. Such layers can be independent and distinct or at least two functions can be combined into the same layer.

The data driver can include a chip-on film 30 on which a data integrated circuit (IC) SD is mounted. One side of the chip-on film 309 is connected to one end of a source PCB 20 and the other side thereof is adhered to the non-display area NDA of the display panel 10.

The data IC SD converts digital video/image data input from the timing controller TC into an analog gamma compensation voltage to generate a data voltage. The data voltage output from the data IC SD is supplied to the data lines D1 to Dm.

The so-called GIP (gate-in-panel) type gate driver includes level shifters LSa and LSb mounted on the source PCB 20, and shift registers SRa and SRb formed in the non-display area NDA of the display panel 10 and receiving signals supplied from the level shifters LSa and LSb.

The level shifters LSa and LSb receive signals such as a start pulse ST, gate shift clocks GCLK, a flicker signal FLK, and the like, from the timing controller TC and receive a driving voltage such as a gate high voltage (VGH), a gate low voltage (VGL), and the like. The start pulse ST, the gate shift clocks GCLK, and the flicker signal FLK are signals swinging between approximately 0V and 3.3V. The gate shift clocks GCLK1-$n$ are n-phase clock signals having a predetermined phase difference. The gate high voltage VGH is a voltage equal to or higher than a threshold voltage of a TFT formed in a TFT array of the display panel 10 and is about 28V. The gate low voltage VGL is a voltage lower than the threshold voltage of the TFT formed in the TFT array of the display panel 10 and is about −5V or so.

The output signals of the level shifter LS can be supplied to the shift register SR through lines formed in the chip-on film 30 in which the source drive IC SD is positioned and line-on-glass (LOG) lines formed at the substrate of the display panel 10. The shift register SR can be formed directly on the non-display area NDA of the display panel 10 through a GIP process.

The shift register SR sequentially shifts gate pulses swinging between the gate high voltage and the gate low voltage VGL by shifting the start pulse VST input from the level shifter LS according to the gate shift clock signals CLK1 to CLKn. The gate pulses output from the shift register SR are sequentially supplied to the gate lines G1 to Gn.

The timing controller TC synchronizes an operation timing of the data IC SD and the gate drivers LSa, LSb, SRa, and SRb upon receiving a timing signal such as a vertical synchronization signal, a horizontal synchronization signal, a data enable signal, and a main clock inputted from a host system. A data timing control signal for controlling the data IC SD can include a source sampling clock (SSC), a source output enable (SOE) signal, and the like. A gate timing control signal for controlling the gate drivers LSa, LSb, SRa and SRb can include a gate start pulse (GSP), a gate shift clock (GSC), gate output enable (GOE) signal, and the like.

In FIG. 2, a configuration in which the shift registers SRa and SRb are disposed on both sides of the display area DA outside the display area DA to supply gate pulses to the gate lines G1 to Gn from both ends of the display area DA is illustrated. However, the disclosure is not limited thereto and the shift register can be disposed only on one side of the display area DA to supply gate pulses to the gate lines G1 to Gn from one side of the display area DA. When the shift registers SRa and SRb are disposed on both sides outside the display area DA, gate pulses having the same phase and the same amplitude are supplied to the gate lines arranged in the same horizontal line of the pixel array.

In the above description, the case where the gate driver is a GIP type is described as an example, but the disclosure is not limited thereto. For example, the gate driver can be mounted on the non-display portion of the display panel, as a chip-on film (COF) type.

Hereinafter, the relationship between the touch routing lines and the power supply electrodes of the touch screen will be described in detail with reference to FIGS. 3 to 5.

Figure 3:
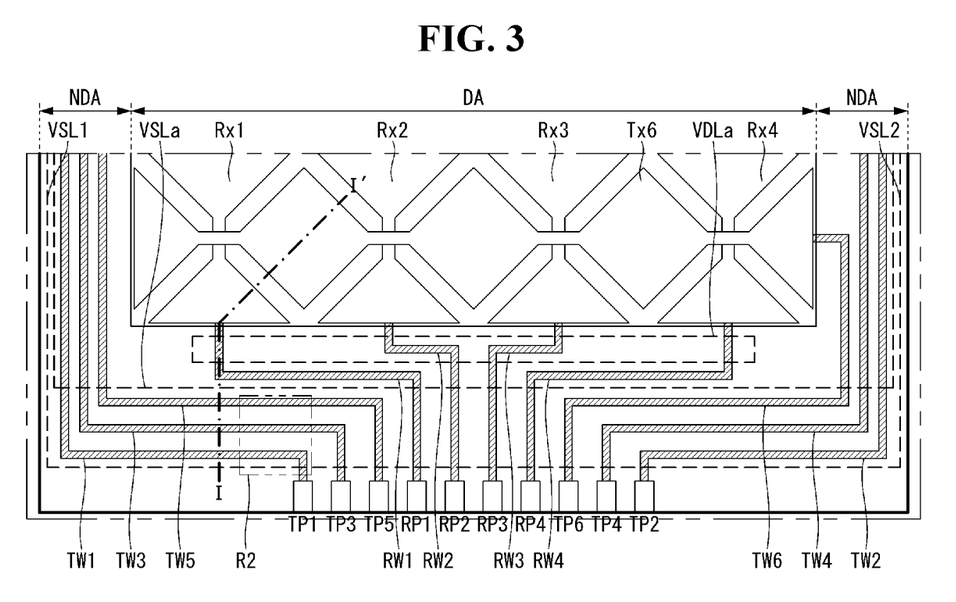
FIG. 3 is an enlarged plan view of a region R1 illustrated in FIG. 1.

FIG. 3 is an enlarged plan view of a region R1 of the electroluminescence display apparatus including the touch screen illustrated in FIG. 1. FIG. 4 is a cross-sectional view of a first example taken along line I-I' illustrated in FIG. 3, and FIG. 5 is a cross-sectional view of a second example taken along line I-I' illustrated in FIG. 3.

Referring to FIG. 3, at least some of the second touch routing lines RW1 to RW4 of the touch screen TS can be disposed to overlap the first power supply electrode VDLa adjacent to the display area DA of the display panel 10. In the drawing, it is illustrated that all the second touch routing lines RW1 to RW4 overlap the first power supply electrode VDLa and all the first touch routing lines TW1 to TW6 overlap the first power supply electrode VDLa, which, however, is not essential and other variations are part of the present invention. In some structure, some of the first touch routing lines TW1 to TW6 can overlap the first power supply electrode VDLa and some of the second touch routing lines RW1 to RW4 cannot overlap the first power supply electrode VDLa.

Also, at least some of the first touch routing lines TW1 to TW6 and the at least some of the second touch routing lines RW1 to RW4 of the touch screen TS can overlap the second power supply electrode VSLa positioned outside the first power supply electrode VDLa. The second power supply electrode VSLa can be connected to the second electrode (cathode electrode) CAT extending from the non-display area (NDA) to the display area DA. The second power supply electrode VSLa can have a width larger than that of the first power supply electrode VDLa. Accordingly, a region where the second power supply electrode VSLa overlaps the first touch routing lines TW1 to TW6 and the second touch routing lines RW1 to RW4 is larger than a region where the first power supply electrode VDLa overlaps the first touch routing lines TW1 to TW6 and the second touch routing lines RW1 to RW4.

Figure 4:
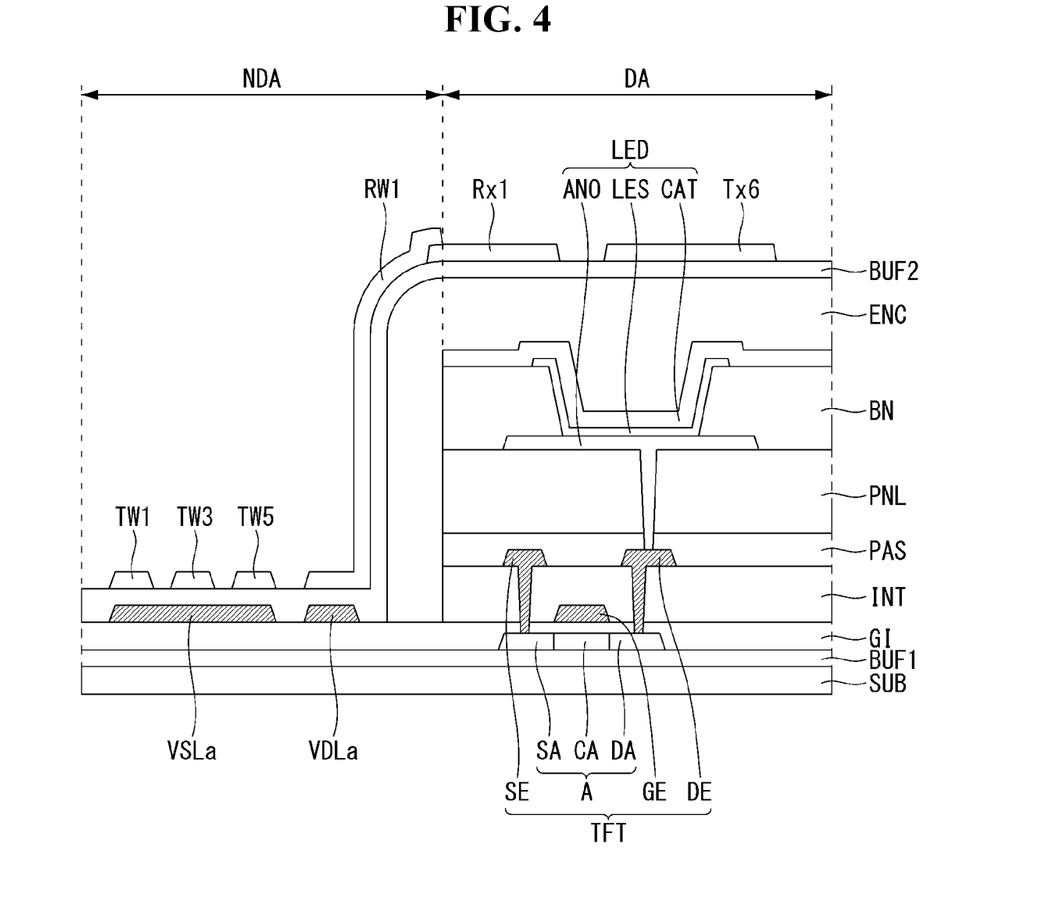
FIG. 4 is a cross-sectional view of a first example taken along line I-I' illustrated in FIG. 3.

Referring to FIG. 4, a buffer layer BUF1 having a single-layer structure or a multi-layer structure can be disposed on a substrate SUB. The substrate SUB can be formed of a flexible semi-transparent material. When the substrate SUB is formed of a material such as polyimide, the buffer layer BUF1 can be formed as a single layer formed of any one of an inorganic material and an organic material to prevent damage to the light emitting device due to an impurity such as an alkali ion, or the like, that flows out from the substrate SUB during a subsequent process. Alternatively, the buffer layer BUF1 can be formed as multiple layers formed of different inorganic materials. Also, the buffer layer BUF1 can also be formed as multiple layers including an organic material layer and an inorganic material layer. The inorganic material layer can include any one of a silicon oxide film (SiOx) and a silicon nitride film (SiNx). The organic material can include a photoacryl.

A semiconductor layer A can be positioned on the buffer layer BUF1 corresponding to the display area DA. The semiconductor layer A can include a source region SA and a drain region DA spaced apart from each other with a channel region CA interposed therebetween. The source region SA and the drain region DA can be conductive regions. The semiconductor layer A can be formed using amorphous silicon or polycrystalline silicon crystallized from amorphous silicon. Alternatively, the semiconductor layer A can be formed of any one of zinc oxide (ZnO), indium zinc oxide (InZnO), indium gallium zinc oxide (InGaZnO), and zinc tin oxide (ZnSnO). Further, the semiconductor layer A can be formed of a low-molecular or high-molecular organic material such as melocyanine, phthalocyanine, pentacene or thiophene polymer.

A gate insulating film GI is positioned on the buffer layer BUF1 on which the semiconductor layer A is positioned, to cover the semiconductor layer A. The gate insulating film GI can be formed as a single layer formed of an inorganic material or as multiple layers formed of different inorganic materials. For example, the gate insulating film GI can be formed of a silicon oxide film (SiOx), a silicon nitride film (SiNx), or a dual-layer thereof.

A gate electrode GE of the TFT and a gate line connected to the gate electrode can be disposed on the gate insulating film GI corresponding to the display area DA such that at least a partial region thereof overlaps a channel layer CA of the semiconductor layer A. The gate electrode GE and the gate line can be formed of any one selected from the group consisting of molybdenum (Mo), aluminum (Al), chrome (Cr), gold (Au), titanium (Ti), nickel (Ni), and copper (Cu), or an alloy thereof, and can be formed as a single layer or multiple layers.

The first power supply electrode VDLa and the second power supply electrode VSLa are disposed a predetermined distance apart on the gate insulating film GI corresponding to the non-display area NDA.

An interlayer insulating film INT can be positioned on the gate insulating film GI on which the gate electrode GE and the gate line are disposed, to cover them. The interlayer insulating film INT can be formed as a single layer formed of an inorganic material or as multiple layers formed of different inorganic materials. For example, the interlayer insulating film INT can be formed as a silicon oxide film (SiOx) or a silicon nitride film (SiNx).

A source electrode SE and a drain electrode DE of the TFT and a data line can be disposed on the interlayer insulating film INT corresponding to the display area DA. The source electrode SE and the drain electrode DE are connected to the source region SA and the drain region DA of the semiconductor layer exposed through the contact holes penetrating through the gate insulating film GI and the interlayer insulating film INT. The source electrode SE, the drain electrode DE, and the data line can be formed of any one selected from the group consisting of Mo, Al, Cr, Au, Ti, Ni, and Cu or an alloy thereof, and can be formed as a single layer or multiple layers.

A passivation film PAS covering the source electrode SE, the drain electrode DE, and the data line can be positioned. The passivation film PAS can be formed as a single layer formed of an inorganic material or as multiple layers formed of different inorganic materials. For example, the passivation film PAS can be formed as a silicon oxide film (SiOx), a silicon nitride film (SiNx), or a dual-layer thereof.

A planarizing film PLN can be positioned on the passivation film PAS. The planarizing film PLN serves to protect a lower structure, while alleviating a step difference of the lower structure, and can be formed of an organic material layer. For example, the planarizing film PLN can be formed of a photoacrylic layer.

An anode electrode ANO can be positioned on the planarizing film PLN. The anode electrode ANO is connected to the drain electrode DE exposed through a contact hole penetrating through the planarizing film PLN and the passivation film PAS. The anode electrode ANO can be formed of a transparent conductive material such as indium tin oxide (ITO), indium zinc oxide (IZO), or zinc oxide (ZnO).

A bank layer BN having an opening exposing the anode electrode AN can be formed on the planarizing film PLN.

The opening of the bank layer BN can be a region defining an emission region LA. A light emitting stack LES and a cathode electrode CAT are sequentially arranged on the anode electrode ANO exposed through the emission region of the bank layer BL to constitute a light emitting device LED. The light emitting stack LES can include a hole-related layer, an emission layer, and an electron-related layer. The cathode electrode CAT can be formed of magnesium (Mg), calcium (Ca), aluminum (Al), silver (Ag) or an alloy thereof having a low work function. In the disclosure, it is illustrated that the light emitting stack LES is positioned on the anode electrode ANO and the cathode electrode CAT is positioned on the light emitting stack LES. However, the light emitting stack LES can be positioned on the cathode electrode CAT and the anode electrode ANO can be disposed on the light emitting stack LES.

An encapsulation film ENC can be positioned on the planarizing film PLN to cover the cathode electrode CA and the bank layer BL. The encapsulation film ENC can serve to prevent penetration of moisture or oxygen from the outside into the light emitting stack LES positioned in the encapsulation film ENC and can have a multilayer structure in which an inorganic layer and an organic layer are alternately arranged.

In case where an uppermost layer of the encapsulation film ENC is an organic film, another buffer layer BUF2 formed of an inorganic insulating film can be additionally positioned on the display area DA and the non-display area NDA.

The first and second touch electrodes Tx1 to Tx6 and Rx1 to Rx4 and the first and second touch routing lines TW1 to TW6 and RW1 to RW4 as shown in FIG. 1 can be disposed on the buffer layer BUF2.

Figure 5:
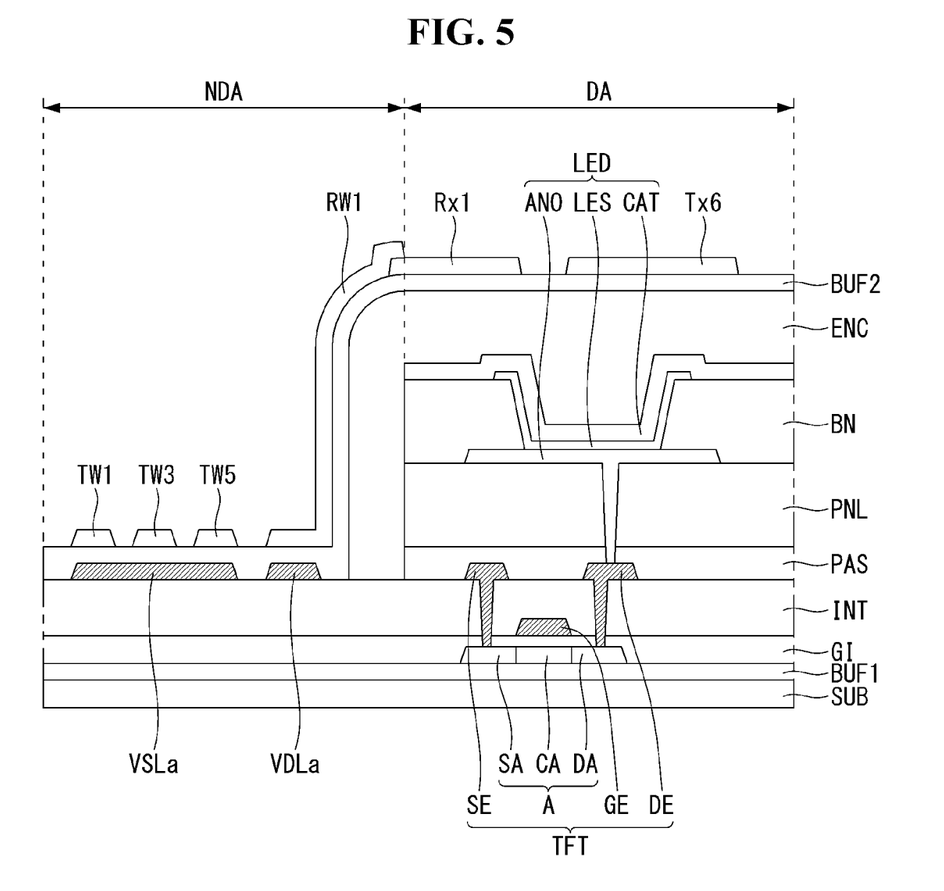
FIG. 5 is a cross-sectional view of a second example taken along line I-I' illustrated in FIG. 3.

Referring to FIG. 5, the configuration is the same as the example of FIG. 4, except that the first power supply electrode VDLa and the second power supply electrode VSLa are formed on the interlayer insulating film INT, instead of the gate insulating film GI corresponding to the non-display area NDA. Therefore, further explanation will be omitted in order to avoid redundant description.

Hereinafter, the relationship between the touch routing lines and a potential supply line of the touch screen TS overlapping each other will be described according to an embodiment of the present disclosure.

Figure 6:
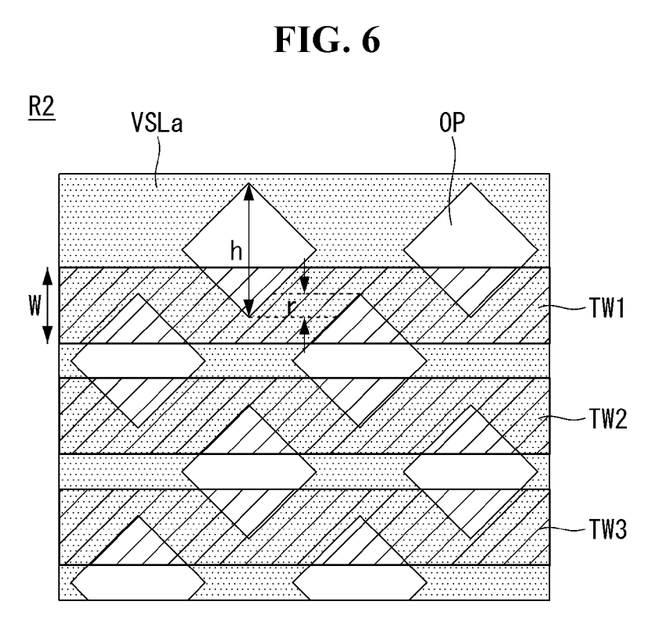
FIG. 6 is a plan view illustrating a first example of a relationship between a touch routing line of a touch screen corresponding to a region R2 of FIG. 3 and a second potential supply line of a display panel according to the present disclosure.
Figure 7:
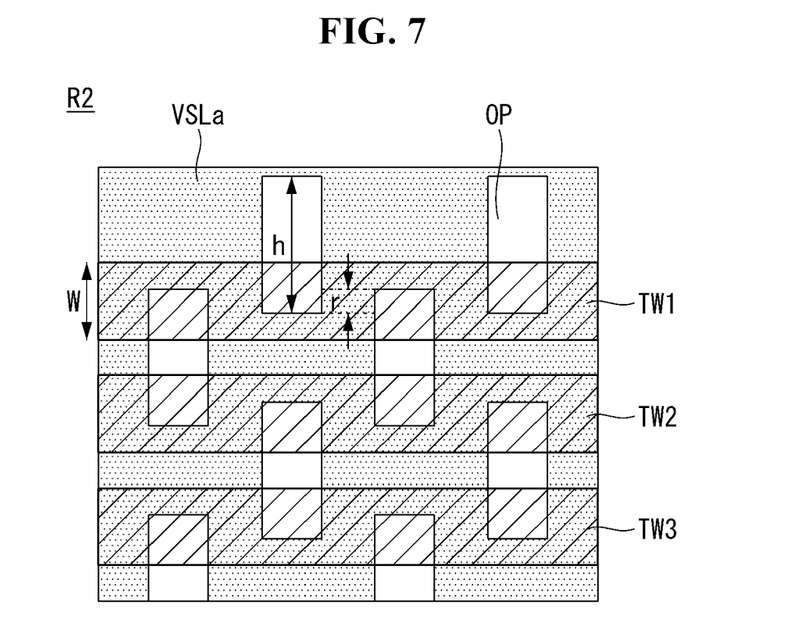
FIG. 7 is a plan view illustrating a second example of a relationship between the touch routing line of the touch screen corresponding to the region R2 of FIG. 3 and the second potential supply line of the display panel according to the present disclosure.

FIG. 6 is a plan view illustrating a first example of a relationship between a touch routing line of a touch screen corresponding to a region R2 of FIG. 3 and a second potential supply line of a display panel. FIG. 7 is a plan view illustrating a second example of a relationship between the touch routing line of the touch screen corresponding to the region R 2 of FIG. 3 and the second potential supply line of the display panel.

Referring to FIGS. 6 and 7, the first touch routing lines TW1, TW3, and TW5 of the touch screen TS overlap the second power supply electrode VSLa of the display panel 10 in the non-display area NDA.

The second power supply electrode VSLa includes a plurality of openings OP which at least partially overlap the first touch routing lines TW1, TW3, and TW5 on the left side of the display area DA and the first touch routing lines TW2, TW4, and TW6 on the right side of the display area DA. The second power supply electrode VSLa includes a plurality of openings OP which at least partially overlap the first touch routing lines TW1, TW3, and TW5.

The total area of the openings overlapping one first touch routing line (e.g., TW1) and the total area of openings overlapping another first touch routing line (e.g., TW2, TW3, TW4, TW5, or TW6) can be equal to each other. In this manner, a magnitude of parasitic capacitance formed between the first touch routing lines TW1 to TW6 of the touch screen TS and the second power supply electrode VSLa of the display panel 10 can be kept constant, whereby a defect due to malfunctions of the touch screen can be reduced and the sensitivity of the touch screen can be enhanced when compared to the related art displays.

Meanwhile, each of the plurality of openings OP of the second power supply electrode VSLa can have any shape such as a square, a rectangle, a rhombus, a circle, an ellipse, or the like, as long as it is regular or same. The plurality of openings OP of the second power supply electrode VSLa can have the same size.

If the openings are formed to be regular and same, the touch routing lines can also be arranged linearly and regularly, and thus, additional consideration for forming the touch routing line is not necessary.

In an example, the vertical length h of each of the openings OP of the second power supply electrode VSLa can be smaller than twice the width w of each of the first touch routing lines TW1, TW3, and TW5 (h<2w).

In the examples of the disclosure, the sum of the area in which one touch routing line and each opening overlap is equal in all of the touch routing lines. This is to prevent occurrence of a case where, in the case of h>2w which does not satisfy the above condition, the sum of the areas where one touch routing line and each opening overlap each other cannot be equal.

In order to regularly arrange the openings, the openings OP of the second power supply electrode VSLa can be arranged such that the y-axis coordinates of the openings OP arranged in odd-numbered rows are the same and the y-axis coordinates of the openings OP arranged in the even-numbered rows are the same. For example, the openings OP of the second power supply electrode VSLa are arranged such that the x-axis coordinates of the openings OP arranged in odd-numbered columns are the same and the x-axis coordinates of the openings OP arranged in the even-numbered columns are the same.

The openings arranged in this manner can have a zigzag pattern in the row or column direction.

A range of overlap length r in the y-axis direction of the openings adjacent to each other in the row direction can be equal to or larger than 0 and smaller than h/2, which is ½ of a vertical length h of the opening (0≤r≤h/2).

If the value r is equal to or larger than h/2, it is impossible to make the sum of the areas where one touch routing line and each opening overlap equal in all touch routing line. If the value r is smaller than 0, it is the same as the existing opening pattern, and thus, the sum of the overlap areas differs.

In the description with reference to FIGS. 6 and 7, the relationship between the second power supply electrode VSLa and the first touch routing lines TW1, TW3 and TW5 has been mainly described. However, the relationship between the second power supply electrode and the other remaining first touch routing lines TW2, TW4, and TW6 and the second touch routing lines RW1 to RW4 is or can be the same as that described above with reference to FIGS. 6 and 7.

In the inventions according to the present disclosure, since the openings of the first power supply electrode or the second power supply electrode overlap the first touch routing lines or the second touch routing lines in the manner described above, possible adjustments can be made such that the magnitude of parasitic capacitance formed therebetween is not different between the first touch routing lines and the second touch routing lines. Therefore, the parasitic capacitance formed between the first touch routing lines TW1 to TW6 of the touch screen TS, and the first power supply electrode VDLa and/or the second power supply electrode VSLa of the display panel 10, and the parasitic capacitance formed between the second touch routing line lines RW1 to RW4 of the touch screen TS and/or the first power supply electrode VDLa and the second power supply electrode VSLa of the display panel 10 can be maintained to be uniform, whereby a defect due to malfunctions of the touch screen can be reduced and the sensitivity of the touch screen can be enhanced when compared to a display apparatus without the inventive structures disclosed herein.

The display apparatus according to the examples of the present disclosure can be described as follows.

An electroluminescence display apparatus having a touch screen according to a first feature of the disclosure includes a display panel including pixels disposed in a display area for displaying information, a first power supply electrode positioned in a non-display area outside the display area and supplying first power to the pixels, and a second power supply electrode supplying second power to the pixels; a plurality of first touch electrodes and a plurality of second touch electrodes disposed in the display area of the display panel and disposed to cross over each other and to be electrically insulated from each other; a plurality of first touch routing lines disposed in the non-display area of the display panel and respectively connected to the plurality of first touch electrodes; and a plurality of second touch routing lines disposed in the non-display area of the display panel and respectively connected to the plurality of second touch electrodes, wherein at least one of the first and second power supply electrodes includes a plurality of first openings overlapping the plurality of first touch routing lines.

At least one of the first and second power supply electrodes can include a plurality of second openings overlapping the plurality of second touch routing lines.

The areas of the first openings of the first power supply electrode overlapping each of the plurality of first routing lines can be equal.

The areas of the first openings of the first power supply electrode overlapping each of the plurality of second routing lines can be equal.

The areas of the second openings of the second power supply electrode overlapping each of the plurality of first routing lines can be equal.

The areas of the second openings of the second power supply electrode overlapping each of the plurality of second routing lines can be equal.

The first and second openings can have the same shape. The first and second openings can have the same size.

A vertical length of each of the first openings of the first power supply electrode can be smaller than twice the width of each of the first touch routing lines overlapping with the first openings.

The vertical length of each of the first openings of the first power supply electrode can be smaller than twice the width of each of the second touch routing lines overlapping the first openings.

The vertical length of each of the second openings of the second power supply electrode can be smaller than twice the width of each of the first touch routing lines overlapping the second openings.

The vertical length of each of the second openings of the second power supply electrode can be smaller than twice the width of each of the second touch routing lines overlapping the second openings.

The y-axis coordinates of the first openings arranged in odd-numbered rows of the first power supply electrode can be the same, and the y-axis coordinates of the first openings arranged in the even-numbered rows of the first power supply electrode can be the same.

The y-axis coordinates of the second openings arranged in the odd-numbered rows of the second power supply electrode can be the same, and the y-axis coordinates of the second openings arranged in the even-numbered rows of the second power supply electrode can be the same.

An overlap length of the first openings adjacent to each other in the row direction, in the y-axis direction, can be zero or greater and can be approximately ½ or greater of the vertical length of the first openings.

An overlap length of the second openings adjacent to each other in the row direction, in the y-axis direction, can be zero or greater, and can be approximately ½ or greater of the vertical length of the second openings.

The pixel can include a semiconductor layer positioned on a substrate and including a source region and a drain region spaced apart from each other with a channel region interposed therebetween; a gate electrode positioned to overlap the channel region on a gate insulating film covering the semiconductor layer; a source electrode and a drain electrode disposed on the interlayer insulating film covering the gate electrode and a gate line and are respectively connected to the source region and the drain region through contact holes penetrating through the gate insulating film and the interlayer insulating film; and a light emitting device disposed on a protective film covering the source electrode and the drain electrode.

The plurality of first and second touch electrodes can be disposed on an encapsulation film covering the light emitting device in the display area, at least one of the first power supply electrode and the second power supply electrode can be positioned in the non-display area of the gate insulating film, and the first and second routing lines can be disposed in the non-display area on an insulating film covering at least one of the first power supply electrode and the second power supply electrode.

The plurality of first and second touch electrodes can be disposed on an encapsulation film covering the light emitting device in the display area, at least one of the first power supply electrode and the second power supply electrode can be positioned in the non-display area of the interlayer insulating film, and the first and second routing lines can be disposed in the non-display area on the insulating film covering at least one of the first power supply electrode and the second power supply electrode.

The inventive features described herein can also be expressed as a display apparatus comprising a display panel having a first power supply electrode and a second power supply electrode and a touch screen structure, operatively connected to the display panel, having first touch routing lines and second touch routing lines. At least one among the first and second power supply electrodes can have openings configured to overlap with at least one among the first and second touch routing lines, to cause a parasitic capacitance formed between the first touch routing lines and at least one among the first and second power supply electrodes, and a parasitic capacitance formed between the second touch routing lines and at least one among the first and second power supply electrodes to be uniform.

The openings can all have the same size arranged in a uniform pattern, and a column direction length of each opening does not exceed two times an individual line width of one among the first and second touch routing lines.

The uniform pattern can have openings at odd numbers rows in the same arrangement, openings at even numbered rows in the same arrangement, and the odd numbered row openings and the even numbered row openings having a staggered relationship with each other.

It will be apparent to those skilled in the art that various modifications and variations can be made in the disclosure without departing from the spirit or scope of the invention. In this disclosure, the electroluminescence display apparatus has been described as an example, but the present disclosure is not limited thereto and can be applied to any display apparatus as long as it is a display apparatus in which an electrode for supplying power to the non-display area of the display panel overlapping the region of the touch screen in which the touch routing lines are disposed.

Also, in the description of embodiments of the present disclosure, the relationship between the second potential supply electrode and the first routing lines has been described as an example, but the disclosure can also be applied in the same manner to a relationship between the first potential supply electrode and the first touch routing lines and/or the second touch routing lines, as well as to the relationship between the second potential supply electrode and the second routing lines. Therefore, the technical scope of the present specification should not be limited to the contents described in the detailed description of the specification but should be defined by the claims.

What is claimed is:

1. A display apparatus having a touch screen, the display apparatus comprising:
   a display panel including pixels disposed in a display area for displaying information, a first power supply electrode positioned in a non-display area outside the display area and supplying first power to the pixels, and a second power supply electrode supplying second power to the pixels;
   a plurality of first touch electrodes and a plurality of second touch electrodes disposed in the display area of the display panel, and disposed to cross over each other and to be electrically insulated from each other;
   a plurality of first touch routing lines disposed in the non-display area of the display panel, and respectively connected to the plurality of first touch electrodes; and
   a plurality of second touch routing lines disposed in the non-display area of the display panel, and respectively connected to the plurality of second touch electrodes,
   wherein at least one of the first and second power supply electrodes includes a plurality of openings overlapping at least one of the plurality of first and second touch routing lines, and wherein the plurality of openings overlap two adjacent ones of the at least one of the plurality of first and second touch routing lines.

2. The display apparatus of claim 1, wherein the first power supply electrode includes first openings of the plurality of openings, the first openings overlapping the plurality of second touch routing lines, or
wherein the second power supply electrode includes second openings of the plurality of openings, the second openings overlapping the plurality of second touch routing lines.

3. The display apparatus of claim 2, wherein
areas of the first openings of the first power supply electrode overlapping each of the plurality of first routing lines are equal, or the areas of the first openings of the first power supply electrode overlapping each of the plurality of second routing lines are equal.

4. The display apparatus of claim 3, wherein
a vertical length of each of the first openings of the first power supply electrode is smaller than twice a width of each of the first touch routing lines overlapping with the first openings.

5. The display apparatus of claim 3, wherein
a vertical length of each of the first openings of the first power supply electrode is smaller than twice a width of each of the second touch routing lines overlapping with the first openings.

6. The display apparatus of claim 3, wherein
y-axis coordinates of the first openings arranged in odd-numbered rows of the first power supply electrode are same, and y-axis coordinates of the first openings arranged in even-numbered rows of the first power supply electrode are same.

7. The display apparatus of claim 3, wherein
an overlap length of the first openings adjacent to each other in a row direction, in a y-axis direction, is zero or greater, and is ½ or greater of a vertical length of the first openings.

8. The display apparatus of claim 2, wherein
areas of the second openings of the second power supply electrode overlapping each of the plurality of first routing lines are equal, or the areas of the second openings of the second power supply electrode overlapping each of the plurality of second routing lines are equal.

9. The display apparatus of claim 8, wherein
a vertical length of each of the second openings of the second power supply electrode is smaller than twice a width of each of the first touch routing lines overlapping with the second openings.

10. The display apparatus of claim 8, wherein
a vertical length of each of the second openings of the second power supply electrode is smaller than twice a width of each of the second touch routing lines overlapping with the second openings.

11. The display apparatus of claim 8, wherein
y-axis coordinates of the second openings arranged in odd-numbered rows of the second power supply electrode are same, and y-axis coordinates of the second openings arranged in even-numbered rows of the second power supply electrode are same.

12. The display apparatus of claim 8, wherein
an overlap length of the second openings adjacent to each other in a row direction, in a y-axis direction, is zero or greater, and is ½ or greater of a vertical length of the second openings.

13. The display apparatus of claim 2, wherein
the first and second openings have a same shape or a same size.

14. The display apparatus of claim 2, wherein
the plurality of first openings and the plurality of second openings are arranged in zigzags in a row direction or in a column direction.

15. The display apparatus of claim 1, wherein at least one of the pixels includes:
a semiconductor layer positioned on a substrate, and including a source region and a drain region spaced apart from each other with a channel region interposed therebetween;
a gate electrode positioned to overlap the channel region on a gate insulating film covering the semiconductor layer;
a source electrode and a drain electrode disposed on an interlayer insulating film covering the gate electrode and a gate line, and respectively connected to the source region and the drain region through contact holes penetrating through the gate insulating film and the interlayer insulating film; and
a light emitting device disposed on a protective film covering the source electrode and the drain electrode.

16. The display apparatus of claim 15, wherein
the plurality of first and second touch electrodes are disposed on an encapsulation film covering the light emitting device in the display area,
at least one of the first power supply electrode and the second power supply electrode is positioned in the non-display area of the gate insulating film, and
the first and second routing lines are disposed in the non-display area on an insulating film covering at least one of the first power supply electrode and the second power supply electrode.

17. The display apparatus of claim 15, wherein
the plurality of first and second touch electrodes are disposed on an encapsulation film covering the light emitting device in the display area,
at least one of the first power supply electrode and the second power supply electrode is positioned in the non-display area of the interlayer insulating film, and
the first and second routing lines are disposed in the non-display area on the insulating film covering at least one of the first power supply electrode and the second power supply electrode.

18. A display apparatus comprising:
a display panel having a first power supply electrode and a second power supply electrode; and
a touch screen structure operatively connected to the display panel, and having first touch routing lines and second touch routing lines,
wherein at least one among the first and second power supply electrodes has openings configured to overlap with at least one among the first and second touch routing lines, to cause a parasitic capacitance formed between the first touch routing lines and at least one among the first and second power supply electrodes, and a parasitic capacitance formed between the second touch routing lines and at least one among the first and second power supply electrodes to be uniform, and
wherein openings belonging to the second power supply electrode overlap two adjacent ones of the first touch routing lines.

19. The display apparatus of claim 18, wherein
the openings of the at least one and the openings belonging to the second power supply electrode all have a same size arranged in a uniform pattern, and a column direction length of each opening among the openings of the at least one and the openings belonging to the second power supply electrode does not exceed two times an individual line width of one among the first and second touch routing lines.

20. The display apparatus of claim 19, wherein the uniform pattern has openings at odd numbers rows in the same arrangement, and openings at even numbered rows in the same arrangement, and the odd numbered row openings and the even numbered row openings have a staggered relationship with each other.

* * * * *